United States Patent
Mohiyaddin et al.

(10) Patent No.: US 12,204,996 B2
(45) Date of Patent: Jan. 21, 2025

(54) CONTROL AND READOUT TOPOLOGY FOR SPIN QUBITS

(71) Applicant: IMEC vzw, Leuven (BE)

(72) Inventors: Fahd Ayyalil Mohiyaddin, Kessel-Lo (BE); Ruoyu Li, Leuven (BE); Bogdan Govoreanu, Hulshout (BE); Steven Brebels, Heverlee (BE)

(73) Assignee: IMEC VZW, Leuven (BE)

( * ) Notice: Subject to any disclaimer, the term of this patent is extended or adjusted under 35 U.S.C. 154(b) by 607 days.

(21) Appl. No.: 17/645,209

(22) Filed: Dec. 20, 2021

(65) Prior Publication Data

US 2022/0198313 A1 Jun. 23, 2022

(30) Foreign Application Priority Data

Dec. 21, 2020 (EP) .................... 20216162

(51) Int. Cl.
*G06N 10/40* (2022.01)
(52) U.S. Cl.
CPC .................... *G06N 10/40* (2022.01)
(58) Field of Classification Search
CPC ........ G06F 30/30; G06N 10/40; G06N 10/00; B82Y 10/00; H01L 29/423; H01L 29/66977
USPC ........................................................ 716/100
See application file for complete search history.

(56) References Cited

U.S. PATENT DOCUMENTS 8,990,761 B2 * 3/2015 Kashiwakura .......... G06F 30/39
716/137

2023/0229952 A1 * 7/2023 Pakkiam ................ G06N 10/40
716/100

FOREIGN PATENT DOCUMENTS

EP 3082073 A1 10/2016

OTHER PUBLICATIONS

Betz et al., "Dispersively Detected Pauli Spin-Blockade in a Silicon Nanowire Field-Effect Transistor", Nano Letters, vol. 15, Issue 7, Jun. 5, 2015, pp. 4622-4627.
Dehollain et al., "Nanoscale broadband transmission lines for spin qubit control", Nanotechnology, vol. 24, Dec. 2012, 10 pages.
Extended European Search Report dated Jun. 21, 2021 in European Application No. 20216162.6, 9 pages.
Hornibrook et al., "Frequency multiplexing for readout of spin qubits", Applied Physics Letters, vol. 104, Mar. 2014, pp. 103106-1 to 103108-4.

(Continued)

*Primary Examiner* — Paul Dinh
(74) *Attorney, Agent, or Firm* — Knobbe Martens Olson & Bear LLP

(57) ABSTRACT

An integrated system for quantum computation is provided, In one aspect, the system includes at least one semiconductor spin quantum bit (qubit); a feedline configured to act as an electron spin resonance (ESR) antenna for control of the at least one qubit; at least one resonator; and a ground plane common to both the feedline and the at least one resonator. The at least one resonator is capacitively coupled to the feedline, and configured for readout of the at least one qubit via the feedline. The feedline and the at least one resonator are arranged in adjacent layers separated by at least a dielectric. A corresponding method of performing quantum computation using such an integrated system is also provided.

11 Claims, 3 Drawing Sheets

(56) References Cited

OTHER PUBLICATIONS

Mi et al., "A coherent spin-photon interface in silicon", Nature, vol. 555, Mar. 29, 2018, pp. 599-613.
Mohiyaddin et al., "Design of a Long-Distance Quantum Interconnect for Spin Qubits using Superconducting Reasonators", IEEE International Interconnect Technology Conference (IITC 2019) and Materials for Advanced Metallization Conference (MAM 2019), 2019, 3 pages.
Mohiyaddin et al., "TCAD-Assisted MultiPhysics Modeling & Simulation for Accelerating Silicon Quantum Dot Qubit Design", 2020 International Conference on Simulation of Semiconductor Processes and Devices (SISPAD), The Japan Society of Applied Physics, Sep. 23, 2020, pp. 253-256.
Samkharadze et al., "High-Kinetic-Inductance Superconducting Nanowire Resonators for Circuit QED in a Magnetic Field", Physical Review Applied, vol. 5, Issue 4, Apr. 2016, 7 pages.
Samkharadze et al., "Strong spin-photon coupling in silicon", Science, vol. 359, Jan. 25, 2018, pp. 1123-1127.
Veldhorst et al., "An addressable quantum dot qubit with fault tolerant control-fidelity", Nature NanoTechnology, vol. 9, Dec. 2014, pp. 981-985.
Zhao et al., "Coherent single-spin control with high-fidelity singlet-triplet readout in silicon", arxiv.org, XP081124556, Cornell University Library, 201 Oline Library Cornell University, Ithaca, NY, Dec. 20, 2018, 7 pages.

\* cited by examiner

CONTROL AND READOUT TOPOLOGY FOR SPIN QUBITS

CROSS-REFERENCE TO RELATED APPLICATIONS

This application claims foreign priority to European Patent Application No. 20216162.6, filed Dec. 21, 2020, the contents of which is incorporated by reference herein in its entirety.

BACKGROUND

Technological Field

The disclosed technology generally relates to the field of quantum computing. In particular, the disclosed technology relates to control and readout of a system using one or more semiconductor spin quantum bits (qubits).

Description of the Related Technology

The field of quantum computation has continued to expand over the last decade with the demonstration of several small-scale prototypes of quantum computers. Semiconductor spin qubits are among the candidates for implementing quantum processors and offer a compact form factor as well as long qubit stability times (in terms of, for example, relaxation and coherence). Such spin qubits are also interesting as they may be manufactured using fabrication techniques similar to those already employed in the microelectronic industry, and it is expected that existing prototypes may be scaled to at least few tens of qubits over the next several years, and enter what is referred to as the Noisy Intermediate-Scale Quantum (NISQ) era of quantum computation.

However, the operation of semiconductor spin qubits, including readout and control, is known to require sophisticated radio frequency (RF) techniques and design. As the number of semiconductor spin qubits on a same chip is expected to increase, the design of, for example, qubit chip wiring fanout and periphery including microwave sources, filtering at various refrigeration stages and printed circuit boards (PCBs), will also become more complex. There is therefore a need for an improved system design having, for example, a reduced number of RF lines interacting with the quantum-chip, in order to ease the design requirements, and also with a reduced footprint of the periphery.

SUMMARY OF CERTAIN INVENTIVE ASPECTS

To at least partly fulfill the above need, the disclosed technology provides an integrated system for quantum computation, as well as a method of performing quantum computation using such an integrated system.

According to a first aspect of the disclosed technology, an integrated system for quantum computation is provided. The system includes at least one semiconductor spin quantum bit (a "qubit"). The system includes a feedline which is configured to act as an electron spin resonance (ESR) antenna for control of the at least one qubit. The system further includes at least one resonator, and a ground plane which is common to both the feedline and the at least one resonator. In the system, the at least one resonator is capacitively coupled to the feedline, and configured for readout of the at least one qubit via the feedline. The feedline and the at least one resonator are arranged in adjacent layers separated by at least a dielectric.

The system as described above provides at least three advantages compared to conventional systems.

A first advantage is obtained by providing the feedline for qubit control and the at least one resonator in different layers separated by the dielectric. In conventional systems, a feedline and resonator are placed in a same plane, and a capacitive coupling therebetween is obtained by, at least in some section of the plane, running the feedline and the resonator in parallel (along an "overlap length") and separated by a finite distance. The capacitive coupling may be increased by decreasing the finite separation between the feedline and the resonator, and/or by increasing the "overlap length" along which the feedline and the resonator runs parallel to each other in the section of the plane. In contrast, in a system according to embodiments of the disclosed technology and the first aspect, the feedline and the at least one resonator instead overlap with an area. The "overlap length" may thereby be reduced while still obtaining a similar capacitive coupling, and the total area (that is, the footprint) of the system may therefore be reduced. For example, a sufficient "overlap length" in the system according to the first aspect may be on the order of tens of micrometers ($\mu m$), compared to several hundreds of micrometers in conventional systems.

A second advantage is also obtained by providing the feedline and the at least one resonator in different planes, separated by at least a dielectric. This allows placing the feedline and the at least one resonator closer to each other (that is, at a distance corresponding to, for example, a thickness of the dielectric, in some instances, a few tens of nanometers). In conventional systems wherein, for example, the feedline and resonator are created in a same plane, the separation distance between the feedline and resonator is rather on the order of several micrometers. Reducing the distance between the feedline and resonator(s) may thereby provide a stronger capacitive coupling and an increased sensitivity to the quantum spin state of the at least one qubit.

A third advantage is obtained by having a shared ground plane between the feedline and the at least one resonator, and the at least one resonator being configured to readout the at least one qubit via the feedline (using, for example, a reflectometry technique). Phrased differently, the feedline may be shared both for control and readout, and having a single (RF) feedline for both qubit control and readout may reduce the number of required RF lines on a chip with, for example, a factor of two. In addition, sharing a ground plane between both the feedline and the resonator(s) may also reduce the overall size of the system, as separate ground planes for each resonator are no longer needed. The ground plane may, for example, "belong to" (that is, be in a same layer as) the feedline, but be utilized also by the resonator(s). These features may lead to a reduced complexity, including also a further reduced footprint compared to a conventional system where, for example, separate RF feedlines are used for qubit control and readout. A reduction of the number of RF feedlines required for qubit control and readout may, for example, also simplify the design of the periphery (including, for example, PCBs, RF filters and coaxial cables).

In one or more embodiments, a thickness of the dielectric may be between 20 nm and 40 nm. This thickness may correspond to the distance between the feedline and the at least one resonator (in a direction perpendicular to the planes).

In one or more embodiments, the system may further include radio frequency (RF) input/output means connected to the feedline.

In one or more embodiments, the RF input/output means may include a combined RF input/output port connected to a same end of the feedline. Having only a single RF input/output port may further reduce complexity and footprint of the system. Also, if having only a single RF input/output port at one end of the feedline, it may be envisaged to position the one or more qubits at the other end of the feedline. By so doing, the position of the one or more qubits may coincide with a node of the RF electric field, such that the one or more qubits may only experience an RF magnetic field while the RF electric field is zero or at least minimal. This absence of RF electric field at the one or more qubits may, for example, help to prevent degradation of stability.

In one or more embodiments, the RF input/output means may include an RF input port connected to one end of the feedline, and an RF output port connected to a different end of the feedline. If positioning the one or more qubits at, for example, the middle of the resonator, both reflection (for example, $S_{11}$) and transmission (for example, $S_{12}$) coefficients may be used to measure the one or more resonators, which may, for example, offer more measurement flexibility and calibration.

In one or more embodiments, an impedance of the at least one resonator may be at least 1 kOhm (kΩ). More in general, it is envisaged that having high impedance resonators may help improving the readout signal. Herein, a "high impedance" may, for example, correspond to an impedance much larger than 50 Ohm.

In one or more embodiments, a Q-factor of the at least one resonator may be within a range of 1000 to 10000.

In one or more embodiments, the at least one qubit may include a plurality of semiconductor spin qubits. The at least one resonator may include a plurality of resonators, and each resonator may have a different resonant frequency for readout of the plurality of qubits using frequency division multiplexing. Having the feedline and the resonators in separate planes may, as described earlier herein, allow the footprint of the system to be reduced, and allow more resonators to be coupled within a same footprint. In addition, the length of the resonators may be reduced as the required "overlap length" is less than in a conventional system (as described above), and cross-talk between the resonators may therefore also be reduced, which may also help to allow for an increased number of coupled resonators and qubits.

In one or more embodiments, the at least one qubit may be implemented using at least one quantum dot. Generally herein, a "qubit" includes, for example, at least an electron and its spin state, and a quantum dot may provide a suitable container for such an electron. Other such "containers", such as, for example, based on donor qubits where a donor atom is implanted in, for example, silicon, and wherein the spin of the extra electron in the donor acts as a qubit, are also envisaged. Herein, a "qubit" may refer only to the spin state of the electron itself, or to the spin state plus structure used to confine the electron carrying the spin (for example, a quantum dot). If not stated explicitly to the contrary, the term "qubit" will be used herein to refer both to the spin state itself and to the container (for example, quantum dot) for an electron carrying the spin state.

According to a second aspect of the disclosed technology, a method of performing quantum computation (using, for example, an integrated system according to any embodiment of the first aspect) is also provided. The method can include both controlling and reading out the state of the at least one semiconductor spin quantum bit using the (same, single) feedline.

In one or more embodiments, the system has a plurality of qubits and resonators (as described above), and the method may then include both controlling and reading out the states of the plurality of semiconductor spin qubits using the feedline and frequency division multiplexing.

The disclosed technology relates to all possible combinations of features described herein, including features recited in the claims. Any advantage or detail specified with reference to a system according to the first aspect apply also to the corresponding method according to the second aspect, and vice versa. Further objects and advantages of the various embodiments of the disclosed technology will be described below by means of exemplifying embodiments.

BRIEF DESCRIPTION OF THE DRAWINGS

Examples of conventional systems along with exemplifying embodiments according to the disclosed technology will be described below with reference to the accompanying drawings, in which.

Figure 1:
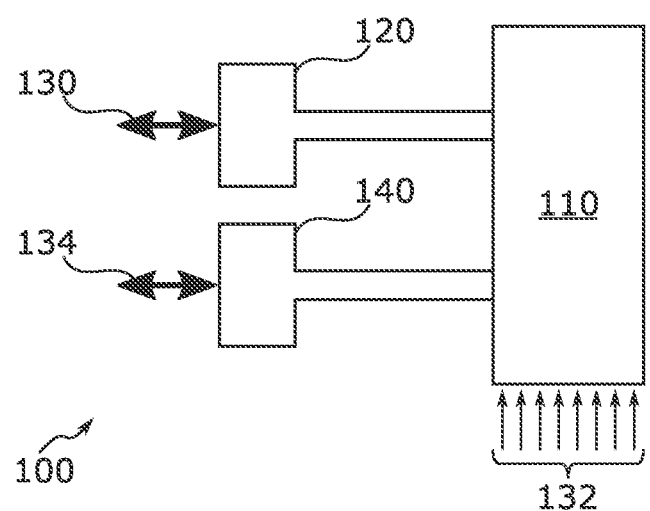
FIG. 1 schematically illustrates a conventional system for quantum computation.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION OF CERTAIN ILLUSTRATIVE EMBODIMENTS

Spin qubits based on, for example, quantum dots in silicon may be used to perform quantum computational operations. The state of the quantum bit (the "qubit") may be encoded in the spin state (that is, "up" or "down") of an electron in the quantum dot, for example, with respect to an externally applied static magnetic field. By being able to both detect and manipulate such a spin state, the qubit may be both read out and controlled as required by various quantum computational algorithms. Further details about the example prevalent methods for control and readout of such qubits will be given below, with reference to FIG. 1. Silicon-based spin qubits have the advantage that they may be manufactured using a technology already present for manufacturing of, for example, conventional transistors. The qubits may be compact in size and span, for example, few tens of nanometers. The qubits may be tunable by the use of one or more gate electrodes, and have descent stability both in terms of relaxation and coherence times. Silicon-based spin qubits may potentially also operate at higher temperature (for example, at single Kelvins, K) in contrast to other qubits which often require at most a few milli-Kelvins (mK) to function properly.

Various techniques have been developed for the readout of qubits, including, for example, using various charge sensors (such as single electron transistors and/or quantum point contacts). Such charge sensors are often compact in their design, and may operate at lower frequency. They may, however, be complex in terms of geometry, and often require several additional DC lines at the qubit side. Other techniques use, for example, gate reflectometry, wherein the geometry on the qubit side is less complex, and where the qubits may operate at higher temperatures. Such techniques, on the other hand, do have other issues such as a need for radiofrequency (RF) signals and hence more complex external circuitry (for example, PCBs, coaxial lines, etc.), especially if more than a single qubit is to be implemented and used.

There have also been developed various techniques for control of qubits, including, for example, those based on magnetic resonance (for example, electron spin resonance, ESR) via transmission lines. Such techniques allow for a smaller qubit dephasing, but may often be slow. Other techniques for qubit control include those based on electric dipole spin resonance (EDSR) with micromagnets, which, although fast, often result in larger qubit dephasing.

To make one qubit interact with another, developed techniques involve, for example, exchange interaction (which leads to less qubit dephasing, but requires larger or extremely tight quantum dot-pitches) and resonators (which allows for quantum dots to be positioned further apart, but which may produce stronger dephasing).

In general, by attempting various combinations of the above techniques, conventional qubit systems often rely on the use of complex external circuitry in order to readout and control the qubits. A particular combination is based on reflectometry for read out, in combination with ESR for control, of the one or more qubits. There is then often a need for various microwave sources, filters at various refrigeration stages and PCBs that can deliver microwave signals to the chip where the qubits are located, and there is also often a need for multiple input and output ports/interfaces for such signals. In addition, the footprint of the qubit chip is often considerably large.

An example of a conventional system for quantum computing will now be described in more detail with reference to FIG. 1.

FIG. 1 schematically illustrates a conventional system 100, including a qubit 110 (or an arrangement of multiple qubits). For readout of the state of the qubit 110, the system 100 includes a resonator 120 to/from which various RF input/output signals 130 may be provided. The qubit 110 is also provided with various DC and low-frequency (for example, sub-GHz) signals 132 for defining, for example, one or more quantum dots within the qubit used to confine an electron carrying the quantum spin state. The qubit 110 may, for example, include barrier gates used to define the quantum dot(s), and particular dot gates with which the energy levels within a dot may be shifted up and down. Readout of the qubit 110 may be performed, for example, by loading a first electron with a particular spin (for example, spin down) on a first quantum dot within the qubit 110, and a second electron (carrying the spin state which is to be determined) may be positioned (using the various gates) at a nearby, second quantum dot. Due to the Pauli exclusion principle, the chance of the second electron tunneling from the second dot to the first dot will depend on the spin state of the second electron. For example, if the first electron on the first quantum dot has spin down, the chance of the second electron tunneling from the second to the first quantum dot is higher if the second electron has an opposite spin state (that is, spin up), and lower or zero if the spin state of the second electron is the same as that of the first electron (that is, spin down). If tunneling occurs, a resonant frequency of the resonator 120 will be changed, and this may be detected via the input/output signals 130. This technique, referred to as "reflectometry", may thus be used to determine the spin state of an electron (and thereby the state of the qubit) in the system 100. This may, for example, be achieved by measuring the amplitude and phase of a signal reflected at the qubit 110. The system 100 may, for example, be a single port system, wherein input and output signals 130 are provided to/from the resonator at a same interface, and wherein the qubit 110 is arranged at an end of the resonator 130. The system 100 may also, instead, be a two-port system, wherein there are separate input and output ports for the respective signals 130, wherein the resonator 120 is connected between the two ports, and wherein the qubit 110 is arranged in a side-branching manner to the resonator 120. For the conventional system(s) to work as intended, the dimensions of the resonator 120 are normally such that its width is a few tens of nanometers (for example, approximately 50-100 nm), its length on the order of millimeters (for example, approximately 1 mm), and its separation to one or more ground planes on the order of micrometers (for example, approximately 1 μm). If the system 100 includes more than one qubit, multiple resonators may be provided, each having slightly different lengths, and each connected to one qubit. As the resonant frequency of each resonator will depend on its length, the states of the different qubits can be determined separately, by adjusting the frequency of the input signals accordingly, such that various resonators are excited individually. As an example, the difference in length between subsequent resonators may be on the order of, for example, 10%.

In the system 100, a resonator is usually arranged without having any physical connection to external circuitry. Instead, one or more feedlines are coupled capacitively to the resonator(s), wherein the feedline(s) is/are located in a same plane as the resonator(s). As described earlier herein, the strength of the capacitive coupling between co-planar feedlines and resonators is determined by the "overlap length" between the resonator and the feedline, that is, the distance along which the resonator runs parallel to the feedline (at a finite separation distance). A required overlap length may normally be on the order of hundreds of micrometers (for example, approximately 500 μm). A resonator is often created by removing part of a ground plane associated with the feedline, and a separation between the feedline and the ground plane, and thereby also the finite distance between the feedline and the resonator, is normally on the order of at least a few micrometers.

As illustrated in FIG. 1, for control of the qubit 110, the system 100 also includes a control feedline 140. The feedline 140 may, for example, be an electron spin resonance (ESR) antenna provided with various RF input/output signals 134, and the feedline 140 may pass sufficiently close to the qubit 110 such that the signals 134 may be used to control the state of the qubit 110. For example, spin resonance may be used wherein first a static magnetic field is applied perpendicular to an interface of the qubit at which a quantum dot containing an electron with the qubit spin state is formed, thereby creating a Zeeman split in energy between electrons having spin up or spin down, where this split in energy is proportional to the strength of the applied static magnetic field. Simultaneously, the spin of the electron will process around the applied static magnetic field with a Larmor frequency also proportional to the strength of the applied static magnetic field. In a reference frame rotating with such a frequency, the spin of the electron will, however, remain still.

By coupling of the feedline 140 to an external microwave (AC) source (via the signals 134), an AC magnetic field may be generated in a direction perpendicular to that of the applied static magnetic field. If the AC magnetic field has a field frequency matching the Zeeman energy splitting, the electron spin may be forced to rotate in the rotating reference frame in a controlled way, where, for example, the combination of length in time and size in amplitude of an applied AC magnetic field pulse (that is, the area defined by a pulse plotted as amplitude versus time) will determine how far the spin has rotated in the rotating reference frame. This technique, known as (pulsed) "electron spin resonance" (ESR) may thus be used to control the spin state and the qubit as desired.

In the system 100, the feedline 140 is also provided with its own ground planes (not shown). Further, if using more than one resonator and more than one qubit, separate feedlines may be provided to each resonator for readout of the qubits. Or, in other conventional alternatives, a single feedline may be capacitively coupled to multiple resonators, allowing the use of a single feedline for readout of the qubits. In any conventional situation, the dimension requirements for the resonators listed above still apply also for such a conventional system, as the feedline and resonators are provided in a same plane.

As is described herein, the disclosed technology improves on the conventional system(s) by providing an integrated system design having a reduced footprint, and in which a reduced number of external RF interfaces to the chip allows the design of the external periphery to be simplified, in addition to facilitating the use of more silicon-based qubits.

Various embodiments of such an integrated system for quantum computation according to the disclosed technology will now be described with reference to FIGS. 2Aa to 2D.

Figure 2A:
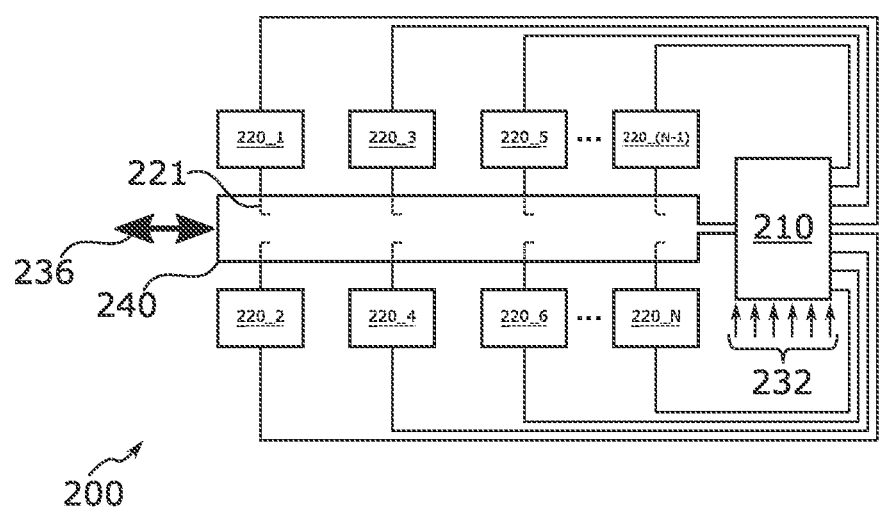
FIG. 2A schematically illustrates an example embodiment of an integrated system for quantum computation according to the disclosed technology.

FIG. 2A schematically illustrates an example embodiment of a system 200 including a qubit arrangement 210 which includes several qubits (a total number of N qubits is assumed here). As will be described in more detail later herein, the qubits may, for example, be defined by several quantum dots formed within the qubit arrangement 210, and the qubit arrangement 210 receives several DC and low-frequency (for example, sub-GHz) signals 232 for defining and controlling the various qubits within the arrangement 210 via, for example, a plurality of gates.

The system 200 includes a plurality of resonators 220_1-N which are used to read out the qubits in the qubit arrangement 210 using reflectometry. As discussed earlier herein, the resonators 220_1-N may have different lengths, such that they each have different resonant frequencies and such that the qubits may be read out individually. Each resonator 220_1-N is coupled to a respective qubit within the qubit arrangement, for example coupled to a gate above the quantum dot used to confine the electron having the qubit spin state.

The system 200 further includes a single feedline 240 which acts as an ESR line/antenna in order to control the various qubits using ESR. The feedline 240 is also capacitively coupled to each resonator 220_1-N, and the feedline 240 can thus also be used to measure the resonators 220_1-N and hence for the individual readout of several qubits. As the resonators 220_1-N have different lengths, frequency (division) multiplexing may be used to both control and read out multiple qubits using only the single feedline 240.

The resonators 220_1-N and the feedline 240 are arranged in different, adjacent planes separated by at least a dielectric, and parts 221 of the resonators 220_1-N extend under the box illustrating the feedline 240. As described earlier, this may allow the feedline 240 and the resonators 220_1-N to be arranged closer to each other (with a finite separation distance corresponding to, for example a size of the dielectric), leading to an improved capacitive coupling without an increase in footprint. From another perspective, a necessary capacitive coupling between the feedline 240 and the resonators 220_1-N may be upheld while the footprint of the system 200 is reduced.

In contrast to the conventional system 100 described herein with reference to FIG. 1, a system (for example, system 200) as envisaged herein uses a single feedline capacitively coupled to one or more resonators, for both readout and control of the one or more qubits.

The feedline 240 and the resonators 220_1-N also share a common ground plane (not shown in FIG. 2A), and a set of signals 236 for both readout and control of the qubits in the qubit arrangement 210 are all provided at a combined RF input/output of the feedline 240 (for example, at an end of the feedline 240 opposite the end where the qubit arrangement 210 is positioned). The readout and control of the qubits may therefore be achieved using a reduced number of RF ports.

Figure 2B:
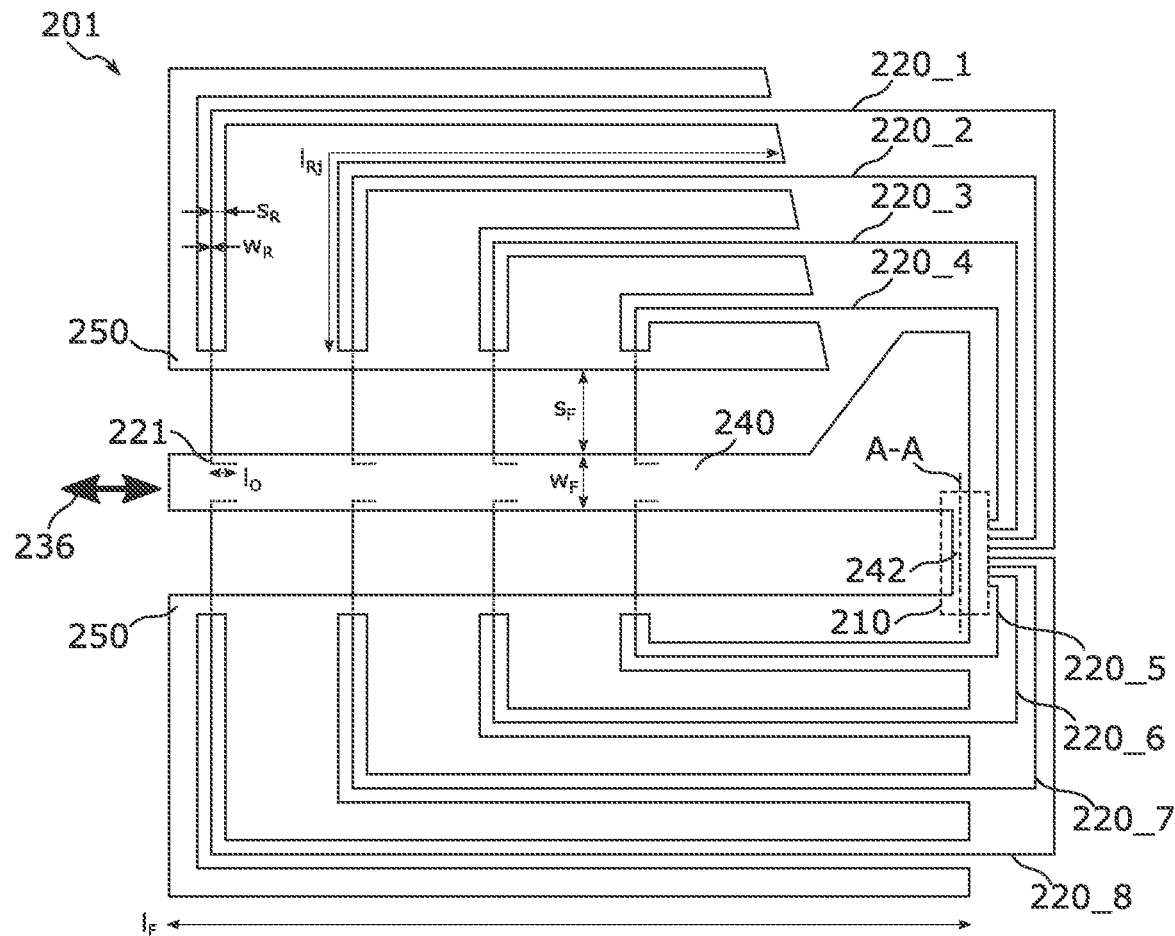
FIG. 2B schematically illustrates an example geometry of a system according to FIG. 2A.

FIG. 2B describes in more detail a geometric layout of an example embodiment of a system 201 based on the system 200 described with reference to FIG. 2A. The same principles discussed for the system 200 apply also to the system 200, and mostly particular details not already discussed for the system 200 will be described below.

The system 201 includes a feedline having a one-port geometry, wherein RF signals 236 including both input and output signals (for both readout and control of the qubits) are provided at a single RF input/output port at an end of the feedline 240. The feedline 240 is also associated with a ground plane 250 which is provided in a same layer as the feedline 240. The ground plane 250 is structured such that it may be shared also with a plurality of resonators 220_1-N which are provided in a layer below that of the feedline 240 and the ground plane 250.

The qubit arrangement 210 is arranged below a part 242 of the feedline, and each resonator 220_j is connected, in an end thereof not used for coupling to the feedline, to a respective qubit in the qubit arrangement 210.

As illustrated in FIG. 2B, the feedline 240 and resonators 220_1-N are defined as having certain dimensions. The feedline has a width $w_F$. A separation distance between the ground plane 250 and the feedline 250 is $s_F$. An overlap length between each resonator 220_1-N and the feedline 240 is $l_O$. Each resonator 220_j (where j is an integer between 1 and N, and where N is the total number of resonators, and qubits) has a length $l_{Rj}$ along which the resonator in question runs along part of the ground plane. In FIG. 2B, the remaining lengths of each resonator (for example, running between the feedline 240 and the ground plane 250, and between the ground plane 250 and the qubit arrangement 210) are, for clarity reasons, illustrated as being of comparable size to length $l_{Rj}$. However, in a manufactured system 201, the lengths of these segments (corresponding to parts of a resonator outside the ground plane 250) are envisaged as being much smaller than $l_{Rj}$, such that in one approximation, the length $l_{Rj}$ may correspond to almost the full length of the resonator 220_j. However, in situations for high impedance (>>50 Ohm) resonators, it may be envisaged that a width $w_R$ (that is, $w_{Rj}$ for resonator 220_j) of a resonator is much smaller than a separation $s_R$ (that is, $s_{Rj}$ for resonator 220_j) between a resonator and the ground plane 250. In such a situation, even if a section of a resonator not running along the ground plane 250 is several micrometers away from the ground plane 250, such a portion of the resonator will still count towards the resonant frequency of the resonator. Thus, even though the sections of a resonator 220_j not included in $I_{Rj}$ are small, the full length of the resonator may be included when designing each resonator to have a specific resonance frequency. The total lengths of resonators 220_j may thus be adapted such that enough discrimination between signals originating from different qubits is obtained. It is envisaged also that the cutouts in the ground plane 250 (wherein the corresponding feedline runs along the ground plane 250) may be tuned in order to achieve a desired resonant frequency.

It is envisaged that various DC and low-frequency signals (not shown in FIG. 2B) are also provided to the qubit arrangement 210, as described earlier herein.

Figure 2C:
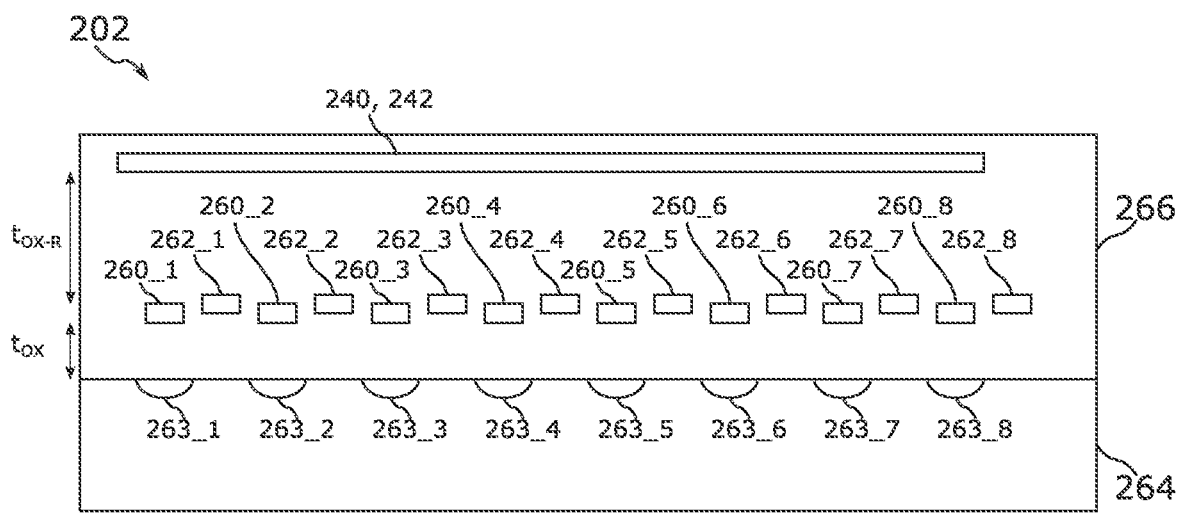
FIG. 2C schematically illustrates a cross-section of the system of FIG. 2B.

FIG. 2C illustrates a cross section 202 of the system 201, including a cross-section of at least parts of the qubit arrangement 210, along the dashed line A-A in FIG. 2B. The feedline 240 (or at least the part 242 thereof) is provided in a separate plane adjacent to that of the various resonators 220_1-N. The various resonators 220_1-N are used as (or at least connects to) gates 260_1-N arranged in another layer, separated from the layer of the feedline 240 by a dielectric 266 (of, for example, $SiO_2$). The qubit arrangement also includes various barrier gates 262_1-N, which together with the gates 260_1-N defined by (or at least connected to) the resonators 220_1-N define a plurality of quantum dots 263_1-N at the interface between the dielectric 266 and a (for example, silicon) substrate 264. Additional gates and reservoirs (such as various confinement gates for confining electrons in dimensions extending perpendicular to the cross-section plane shown in FIG. 2C to fully define the quantum dots, reservoir gates for controlled provision of electrons into/out of the various quantum dots, corresponding reservoirs, additional 2 DEGs, etc.) and similar may also be included in the qubit arrangement, but are not shown in FIG. 2C. The gates not formed by, or connected to, the resonators 220_1-N may be connected to various DC or low-frequency voltages, as provided, for example, by the DC and low-frequency signals 232 illustrated in FIG. 2A.

A separation distance between the layer of the feedline 250 and the layer of the resonators 220_1-N is $t_{OX-R}$. A separation between the gates and the interface where the quantum dots 263_1-N are formed is $t_{OX}$. A width of a quantum dot 263_j is $w_D$. A length of a quantum dot 263_j (for example, in a cross-sectional plane perpendicular to that shown in FIG. 2C) is $l_D$. A spacing between two nearby quantum dots 263_j is $b_D$.

Figure 2D:
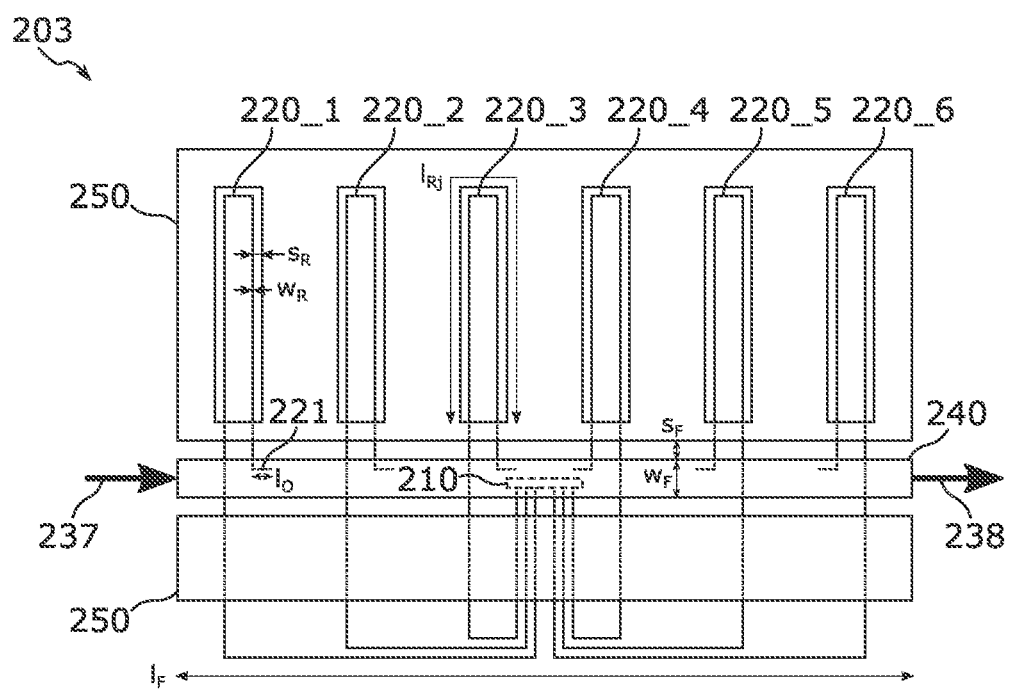
FIG. 2D schematically illustrates another example geometry of a system according to FIG. 2A.

FIG. 2D schematically illustrates yet another example embodiment of a system 203 including six resonators 220_1-6 coupled to a qubit arrangement 210 which may, for example, also include six qubits. It is of course envisaged that other numbers of resonators and/or qubits may be used, and the system 203 is only one possible envisaged example. This applies to any system disclosed herein, such as, for example, the system 201 described with reference to FIG. 2B, wherein the total number of qubits and/or resonators are not necessarily eight.

The features of the system 203 are (if not stated to the contrary) the same as those already described above. However, in contrast to the system 201 described herein with reference to FIG. 2B, the system 203 has a two-port geometry wherein an input port is arranged at one end of the feedline 240 (for receiving an RF input signal 237), and an output port is arranged at another end of the feedline 240 (for receiving an RF output signal 238). Instead of being located at an end of the feedline 240, the qubit arrangement 210 is positioned at approximately the middle of (and below) the feedline 240. As described earlier, there is not necessarily a node in the RF electric field at the position of the qubit arrangement 210, but the use of separate input and output ports at each end of the feedline 240 may allow both a reflection coefficient ($S_{11}$) and a transmission coefficient ($S_{12}$) to be used as parameters for calibration and operation of both the readout and control of the qubit arrangement 210 using the single feedline 240.

As already stated with regards to the system 201 of FIG. 2B, the full lengths $l_{Rj}$ of the various resonators are taken into account when determining the resonant frequency for each resonator. To tune these resonant frequencies such that they are sufficiently different from each other (in order to use frequency (division) multiplexing for readout/control of the qubits), it is envisaged that, for example, the width of the cutouts in the ground plane 250 for each resonator may be different, and/or that the lengths of the resonators outside of the ground plane 250 may be adapted accordingly, even though these lengths are envisaged as being small compared with the lengths $l_{Rj}$ of the sections of the resonators 220_j running along the ground plane 250 within their dedicated cutouts in the ground plane 250, as described earlier herein. For example, although illustrated as being symmetric in FIG. 2D, a total length of, for example, resonator 220_1 does not need to exactly match that of the resonator 220_6; a total length of, for example, resonator 220_2 does not need to exactly match that of resonator 220_5, and similarly for resonators 220_3 and 220_4.

In systems as described herein according to one or more aspects of the disclosed technology, the various dimensions given in, for example, FIGS. 2B, 2C and 2D may, for example, be the following: $w_F$ may be on the order of few micrometers (for example but not limited to, approximately 4.2 µm); $s_F$ may be on the order of few micrometers (for example but not limited to, approximately 3 µm); $l_F$ may be on the order of few millimeters (for example but not limited to, approximately 1 mm); $l_O$ may be on the order of few tens of micrometers (for example but not limited to, 40 µm); $w_{Rj}$ may be on the order of few tens of nanometers (for example but not limited to, approximately 50 nm); $s_{Rj}$ may be on the order of a few micrometers (for example but not limited to, approximately 1 µm); $l_{Rj}$ may be on the order of fractions of millimeters to a few millimeters (for example but not limited to, approximately 0.5-1.1 mm); each $l_{Rj}$ may differ by, for example but not limited to, approximately 10%; $t_{OX-R}$ may be on the order of few tens of nanometers (for example but not limited to, approximately 20-40 nm, such as, for example, 30 nm); $t_{OX}$ may be on the order of few nanometers (for example but not limited to, approximately 8 nm); $w_D$ may be on the order of few tens of nanometers (for example but not limited to, approximately 50 nm); $l_D$ may be on the order of few tens of nanometers (for example but not limited to, approximately 50 nm), and $b_D$ may be on the order of few tens of nanometers (for example but not limited to, approximately 30 nm). It should be noted that the dimensions given are only approximate in nature, and variations thereof may be possible while still falling within the concept of the disclosed technology. The dimensions here presented should therefore not be seen as limiting, but instead as exemplifying one of many possible embodiments.

What should be noted in particular, however, is that, for example, the overlap distance $l_O$ between a resonator and the feedline is here on the order of few tens of micrometers, while a conventional system not according to the disclosed technology requires overlap distances normally on the order of few hundreds of micrometers. Likewise, the separation $t_{OX-R}$ between a resonator and a feedline is here on the order of few tens of nanometers, while in conventional systems the separation between a feedline and a resonator (all located in a same plane) is at least some multiple of the separation distance between the feedline and its ground plane, that is, at least few or even tens of micrometers. The dimensions of a system according to the disclosed technology, due to positioning of the feedline and the resonators in different layers, may thereby provide both an increased coupling strength and/or a reduced footprint of the system, as, for example, the overlap distances may be reduced while still obtaining a sufficient coupling strength, and vice versa.

Herein, when referring to a ground plane as being "shared" between both the feedline and resonator(s), it is envisaged that a same ground plane may be used for return current paths for both the feedline and resonator(s). If the return current is an AC current, such current is transferred to the ground plane via capacitive coupling, even if the ground plane is not in direct physical contact with either the feedline or the resonator(s). For the resonator(s), such capacitive coupling is envisaged as being distributed along, for example, the section of the resonator which runs along a cutout in the ground plane. A similar capacitive coupling also occurs between the feedline and the ground plane.

Although FIGS. 2A to 2D illustrate various embodiments wherein the system includes multiple qubits, it is envisaged also that the system may contain only a single qubit. Even with a single qubit, the benefit of the feedline and resonator in separate layers are present, as well as the benefit originating from having a reduced number of required input/output ports (as a result of using a same, single feedline for both readout and control of the qubit/qubits). In a system with only a single qubit, the need for frequency multiplexing may of course be avoided at least in the sense of qubit readout. Pulses for readout and control may still have different frequencies.

In short summary, the disclosed technology provides a system in which a single, shared feedline is used for both readout and control of one or more qubits, where a ground plane is shared between the feedline and the one or more resonators, and where the feedline and resonator(s) are located in different planes separated by a dielectric. This allows a less complex structure to be created, wherein the footprint may be reduced while still achieving sufficient capacitive coupling between, for example, the feedline and resonators in order to readout and control the qubit, and where the number of needed input/output ports may be reduced leading to even further reduction of complexity and footprint.

Although features and elements may be described above in particular combinations, each feature or element may be used alone without the other features and elements or in various combinations with or without other features and elements.

Additionally, variations to the disclosed embodiments may be understood and effected by the skilled person in practicing the disclosed technology, from a study of the drawings, the disclosure, and the appended claims. In the claims, the words "comprising" and "including" do not exclude other elements, and the indefinite article "a" or "an" does not exclude a plurality.

What is claimed is:

1. An integrated system for quantum computation, comprising:
    at least one semiconductor spin quantum bit (qubit);
    a feedline configured to act as an electron spin resonance (ESR) antenna for control of the at least one qubit;
    at least one resonator; and
    a ground plane common to both the feedline and the at least one resonator,
    wherein the at least one resonator is capacitively coupled to the feedline, and configured for readout of the at least one qubit via the feedline, and
    wherein the feedline and the at least one resonator are arranged in adjacent layers separated by at least a dielectric.

2. The system of claim 1, wherein a thickness of the dielectric is between 20 nm and 40 nm.

3. The system of claim 1, further comprising means for radio frequency (RF) input/output connected to the feedline.

4. The system of claim 1, further comprising a combined RF input/output port connected to a same end of the feedline.

5. The system of claim 1, further comprising an RF input port connected to one end of the feedline, and an RF output port connected to a different end of the feedline.

6. The system of claim 1, wherein an impedance of the at least one resonator is at least 1 kOhm.

7. The system of claim 1, wherein a Q-factor of the at least one resonator is within the range of 1000 to 10000.

8. The system of claim 1, wherein the at least one qubit includes a plurality of semiconductor spin qubits, wherein the at least one resonator includes a plurality of resonators, and wherein each resonator has a different resonant frequency for readout of the plurality of qubits using frequency division multiplexing.

9. The system of claim 1, wherein the at least one qubit is implemented using at least one quantum dot.

10. A method of performing quantum computation using an integrated system according to claim 1, comprising controlling and reading out the state of the at least one semiconductor spin quantum bit (qubit) using the feedline.

11. The method according to claim 10, further comprising controlling and reading out the states of a plurality of semiconductor spin qubits (qubits) using the feedline and frequency division multiplexing.

* * * * *